United States Patent
Kamiya (10) Patent No.: US 8,138,043 B2
(45) Date of Patent: Mar. 20, 2012

(54) NON-VOLATILE SEMICONDUCTOR MEMORY DEVICE AND METHOD OF MANUFACTURING THE SAME

(75) Inventor: Eiji Kamiya, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/088,030

(22) Filed: Apr. 15, 2011

(65) Prior Publication Data

US 2011/0195558 A1    Aug. 11, 2011

Related U.S. Application Data (60) Continuation of application No. 12/705,409, filed on Feb. 12, 2010, now Pat. No. 7,948,026, which is a continuation of application No. 11/749,506, filed on May 16, 2007, now Pat. No. 7,678,663, which is a continuation of application No. 11/083,930, filed on Mar. 21, 2005, now Pat. No. 7,297,594, which is a division of application No. 10/614,006, filed on Jul. 8, 2003, now Pat. No. 6,897,524.

(30) Foreign Application Priority Data

Jul. 9, 2002 (JP) ................................ 2002-199915

(51) Int. Cl.
*H01L 21/336* (2006.01)

(52) U.S. Cl. ............... 438/258; 438/427; 257/E21.691; 257/E21.686

(58) Field of Classification Search .................. 257/261, 257/314, 315, 326, E21.686, E21.691; 438/258, 438/296, 400, 424, 427, 700, 697
See application file for complete search history.

(56) References Cited

U.S. PATENT DOCUMENTS

| | | | |
|---|---|---|---|
| 5,600,164 A | | 2/1997 | Ajika et al. |
| 6,133,093 A | * | 10/2000 | Prinz et al. ................. 438/257 |
| 6,159,799 A | | 12/2000 | Yu |
| 6,165,849 A | | 12/2000 | An et al. |
| 6,222,225 B1 | | 4/2001 | Nakamura et al. |
| 6,316,293 B1 | | 11/2001 | Fang |
| 6,417,051 B1 | * | 7/2002 | Takebuchi ................. 438/287 |
| 6,559,029 B2 | | 5/2003 | Hur |
| 6,559,055 B2 | | 5/2003 | Tuan et al. |

(Continued)

FOREIGN PATENT DOCUMENTS

JP    2-299039    12/1990

(Continued)

*Primary Examiner* — David Vu (74) *Attorney, Agent, or Firm* — Oblon, Spivak, McClelland, Maier & Neustadt, L.L.P.

(57) ABSTRACT

A method of manufacturing a non-volatile semiconductor memory device including previously forming a recess in a first peripheral region on a semiconductor substrate, forming a first gate insulator having a first thickness in the recess, forming a second gate insulator having a second thickness less than the first thickness in an array region and a second peripheral region on the semiconductor substrate, successively depositing first and second gate electrode films and first and second mask insulators on each of the first and second gate insulators, forming an isolation trench on a surface of the semiconductor substrate to correspond to each position between the array region and the first and second regions of the peripheral region, depositing a buried insulator on the entire surface, and polishing an upper surface of the buried insulator so that the upper surface can be planarized.

9 Claims, 5 Drawing Sheets

U.S. PATENT DOCUMENTS

| | | |
|---|---|---|
| 6,605,506 B2 | 8/2003 | Wu |
| 6,624,468 B2 | 9/2003 | Takebuchi |
| 6,642,105 B2 | 11/2003 | Kim et al. |
| 6,815,755 B2 | 11/2004 | Colclaser et al. |
| 7,057,226 B2 | 6/2006 | Lee |

FOREIGN PATENT DOCUMENTS

| | | |
|---|---|---|
| JP | 3-102877 | 4/1991 |
| JP | 3-272095 | 12/1991 |
| JP | 8-55909 | 2/1996 |
| JP | 8-88360 | 4/1996 |
| JP | 10-199994 | 7/1998 |
| JP | 10-289990 | 10/1998 |
| JP | 2000-174150 | 6/2000 |
| JP | 2001-060674 | 3/2001 |
| JP | 2001-85647 | 3/2001 |
| JP | 2002-64157 | 2/2002 |
| JP | 2003-46062 | 2/2003 |
| WO | WO 01/47012 A1 | 6/2001 |

* cited by examiner

NON-VOLATILE SEMICONDUCTOR MEMORY DEVICE AND METHOD OF MANUFACTURING THE SAME

CROSS-REFERENCE TO RELATED APPLICATIONS

This application is a continuation of and claims priority under 35 U.S.C. §120 from U.S. Ser. No. 12/705,409, filed Feb. 12, 2010, which is a continuation of U.S. Ser. No. 11/749,506, filed May 16, 2007, (now U.S. Pat. No. 7,678,663 issued Mar. 16, 2010), which is a continuation of U.S. Ser. No. 11/083,930, filed Mar. 21, 2005 (now U.S. Pat. No. 7,297,594, issued Mar. 21, 2005), which is a division of U.S. Ser. No. 10/614,006, filed Jul. 8, 2003 (now U.S. Pat. No. 6,897,524, issued May 24, 2005), and is based upon and claims the benefit of priority under 35 U.S.C. §119 from the prior Japanese Patent Application No. 2002-199915, filed Jul. 9, 2002. The entire contents of these applications are incorporated herein by reference.

BACKGROUND OF THE INVENTION

1. Field of the Invention

The present invention relates to a non-volatile semiconductor memory device and a method of manufacturing the same. More particularly, the present invention relates to a NAND-type flash memory, which includes a floating gate electrode and two or more gate oxide films having a different thickness in peripheral and cell sections.

2. Description of the Related Art

Recently, the development of a NAND-type flash memory has been made. The NAND-type flash memory is formed by gate pre-forming (or gate oxide film pre-forming) process. According to the gate pre-forming process, trench isolation is employed, and several gate oxide films having different thickness are separately formed.

Figure 5A:
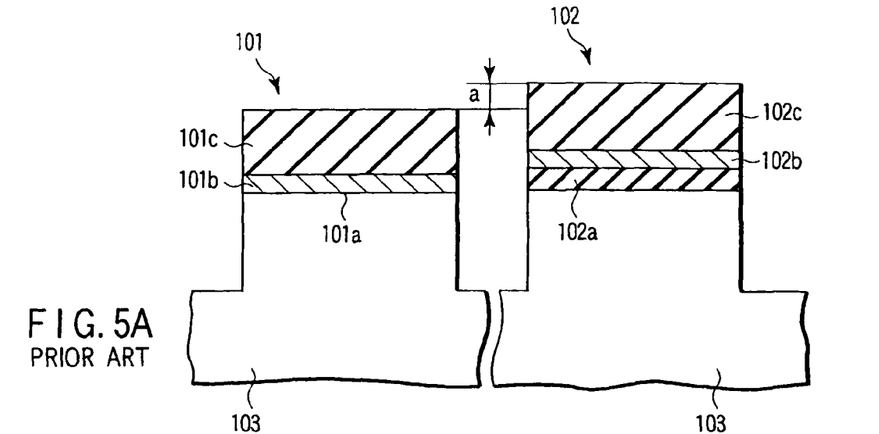
FIG. 5A and FIG. 5B are cross-sectional views showing the process of manufacturing a NAND-type flash memory to explain the prior art and the problem.
Figure 5B:
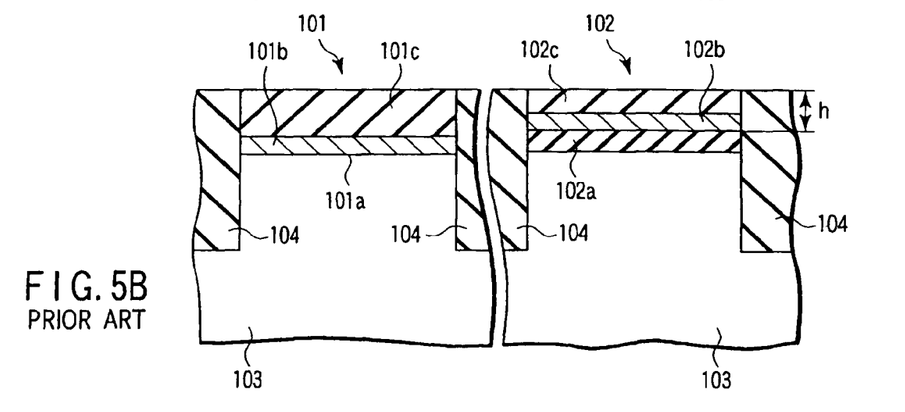

However, in the NAND-type flash memory, gate oxide films 101a and 102a on a silicon (Si) substrate 103 are different in their thickness between a cell/Vcc section 101 and a Vpp section 102, as shown in FIG. 5A. For this reason, a step (a) is formed in the upper surface of SiN films (stopper SiN films) 101c and 102c on gate electrodes 101b and 102b. For example, the step (a) is a factor of causing the following disadvantage in shallow-trench isolation (STI) formation. As illustrated in FIG. 5B, a difference is made in the thickness of SiN films when the upper surface of a buried insulator 104 is removed by chemical mechanical polishing (CMP) using SiN films 101c and 102c as a stopper. More specifically, the SiN film 102c of the Vpp section 102 is thinner than the SiN film 101c of the cell/Vcc section 101. The excess thickness reduction of the SiN film 102c is a factor of reducing the a height (h) to the gate oxide film 102a. As a result, the gate oxide film 102a is easily damaged by etching (e.g., wet etching) after CMP. The gate oxide film 102a being damaged is a factor in causing failure such as gate leakage.

Figure 6:
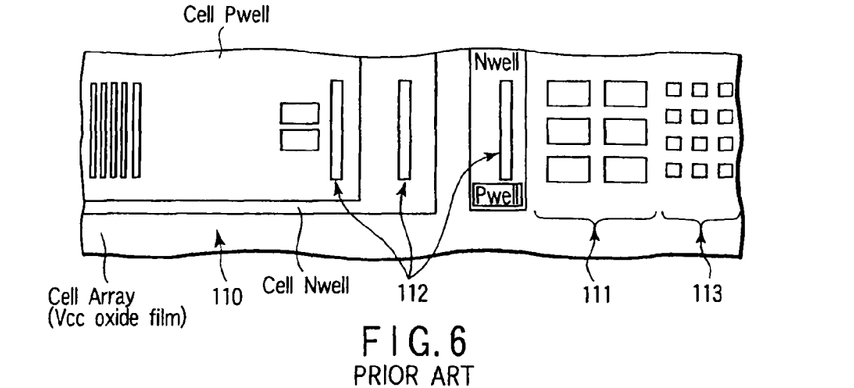
FIG. 6 is a plan view showing a conventional a NAND-type flash memory.

In particular, the NAND-type flash memory has a high-voltage row decoder circuit 111. As shown in FIG. 6, the row decoder circuit 111 is arranged in a peripheral region (corresponding to Vpp section 102) adjacent to a cell array region (Cell Array) 110 corresponding to the cell/Vcc section 101. Normally, the row decoder circuit 111 is formed using a gate oxide film for Vpp system (Vpp oxide film 102a). In other words, a high-voltage transistor exists in the row decoder circuit 111 of the NAND-type flash memory.

Conversely, a Vcc oxide film 101a is used, in general, in the cell array region 110, a guard ring 112 arranged between the cell array region 110 and the row decoder circuit 111 and a dummy AA pattern 113 near the row decoder circuit 111. For this reason, when a film to make a buried insulator 104 is subjected to CMP in STI formation, the SiN film 102c of the row decoder circuit 111 is excessively reduced in thickness as compared with the SiN film 101c. This is a factor in causing the foregoing failure.

In the conventional case, it is possible to readily realize the NAND-type flash memory having several gate oxide films of different thicknesses according to the gate pre-forming process. However, the stopper SiN film of the row decoder circuit is greatly reduced in thickness by CMP in the STI formation. As a result, the gate oxide film under the stopper SiN film is easily damaged; for this reason, there is a problem that failure such as gate leakage occurs.

BRIEF SUMMARY OF THE INVENTION

According to a first aspect of the present invention, there is provided a non-volatile semiconductor memory device comprising: a semiconductor substrate; a memory cell array formed on the semiconductor substrate, and including a first gate insulator having a first thickness; a high-voltage transistor circuit formed on the semiconductor substrate, and including a second gate insulator having a second thickness greater than the first thickness; and a peripheral circuit formed on the semiconductor substrate, and including the second gate insulator.

According to a second aspect of the present invention, there is provided a method of manufacturing a non-volatile semiconductor memory device, comprising: successively depositing a first gate insulator having a first thickness, a first gate electrode film and a first mask insulator on a semiconductor substrate; leaving the first gate insulator, the first gate electrode film and the first mask insulator in only array region; separately forming the following gate insulators in a peripheral region excepting the array region, that is, forming a second gate insulator having a second thickness greater than the first thickness in a first region of a peripheral region, and forming a third gate insulator having a thickness the same as the first thickness in a second region of the peripheral region; successively depositing a second gate electrode film and a second mask insulator thicker than the first mask insulator on each of the first mask insulator, the second gate insulator and the third gate insulator; removing the second mask insulator and the second gate electrode film on the first mask insulator; forming an isolation trench on a surface of the semiconductor substrate to correspond to each position between the array region and first and second regions of the peripheral region; depositing a buried insulator on the entire surface; and polishing an upper surface of the buried insulator so that the upper surface can be planarized.

According to a third aspect of the present invention, there is provided a method of manufacturing a non-volatile semiconductor memory device, comprising: successively depositing a first gate insulator having a first thickness, a first gate electrode film and a first mask insulator on a semiconductor substrate; leaving the first gate insulator, the first gate electrode film and the first mask insulator in only an array region and a first peripheral region; forming a second gate insulator having a second thickness greater than the first thickness in a second peripheral region excepting the array region and the first peripheral region; successively depositing a second gate electrode film thinner than the first gate electrode film and a second mask insulator on each of the first mask insulator and the second gate insulator; removing the second mask insulator and the second gate electrode film on the first mask insulator; forming an isolation trench on a surface of the semiconductor substrate to correspond to each position between the array region and first and second regions of the peripheral region; depositing a buried insulator on the entire surface; and polishing an upper surface of the buried insulator so that the upper surface can be planarized.

According to a fourth aspect of the present invention, there is provided a method of manufacturing a non-volatile semiconductor memory device, comprising: previously forming a recess in a first peripheral region on a semiconductor substrate; forming a first gate insulator having a first thickness in the recess; forming a second gate insulator having a second thickness less than the first thickness in an array region and a second peripheral region on the semiconductor substrate; successively depositing first and second gate electrode films and first and second mask insulators on each of the first and second gate insulators; forming an isolation trench on a surface of the semiconductor substrate to correspond to each position between the array region and the first and second regions of the peripheral region; depositing a buried insulator on the entire surface; and polishing an upper surface of the buried insulator so that the upper surface can be planarized.

DETAILED DESCRIPTION OF THE INVENTION

Embodiments of the present invention will be described below with reference to the accompanying drawings.

First Embodiment

Figure 1A:
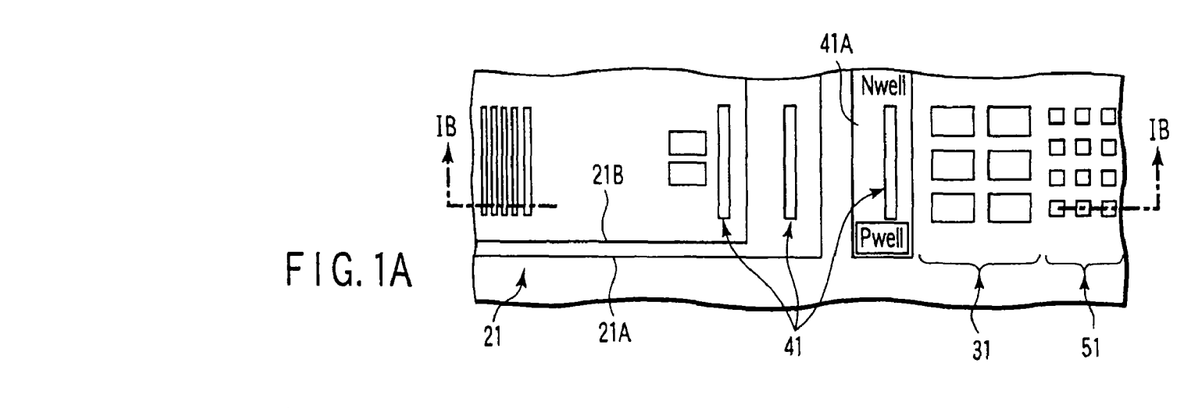
FIG. 1A is a plan view showing a NAND-type flash memory according to a first embodiment of the present invention.
Figure 1B:
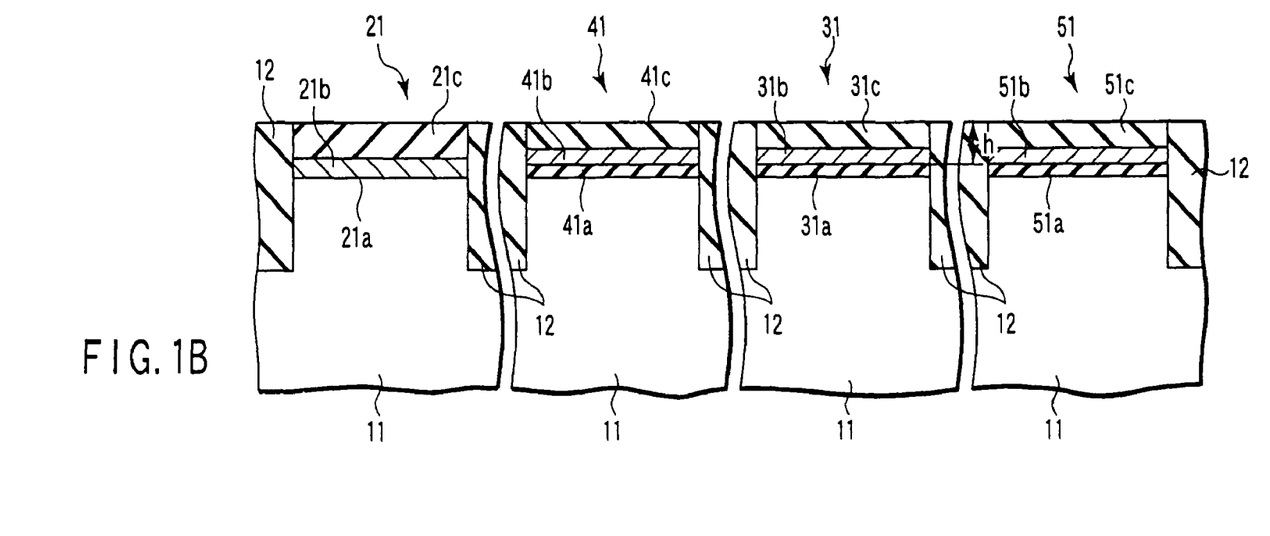
FIG. 1B is a cross-sectional view taken along a line IB-IB of FIG. 1A.

FIG. 1A and FIG. 1B show the structure of a NAND-type flash memory formed by gate pre-forming (or gate oxide pre-forming) process according to a first embodiment of the present invention. FIG. 1A is a plan view showing principal parts of the NAND-type flash memory, and FIG. 1B is an enlarged view showing the sectional structure substantially corresponding to line IB-IB of FIG. 1A.

In the NAND-type flash memory, a cell array 21 is formed in an array region on a Si substrate 11. A high-voltage row decoder circuit (high-voltage transistor) 31 is formed in a peripheral region adjacent to the cell array 21. A guard ring 41 functioning as a peripheral circuit is formed between the cell array 21 and the row decoder circuit 31. The peripheral region is formed with a dummy AA pattern (peripheral circuit) near the row decoder circuit 31.

In the cell array 21, an N-well region (Cell N-well) 21A is formed on the surface of the Si substrate 11. In the N-well region 21A, a P-well region (Cell P-well) 21B is formed. A plurality of memory cells (not shown) are formed on the surface of the P-well region 21B. Each memory cell has a structure in which a poly gate electrode (first gate electrode film) 21b and a SiN film (first mask insulator) 21c are stacked on a Vcc gate oxide film (Vcc oxide film) 21a. The poly gate electrode includes such as poly silicon, polycide and the like. The gate oxide film 21a is a first gate insulator having a first thickness. The SiN film 12c functions as the stopper in CMP.

Conversely, the row decoder circuit 31, guard ring 41 and dummy AA pattern 51 are formed using high breakdown voltage (Vpp) gate oxide films (Vpp oxide film) 31a, 41a and 51a, respectively. Each of the gate oxide films 31a, 41a and 51a is a second gate insulator having a second thickness greater than the first thickness of the gate oxide film 21a. In other words, the row decoder circuit 31 includes a high-voltage transistor (not shown) formed on the surface of the Si substrate 11. The high-voltage transistor has a structure in which a poly gate electrode (second gate electrode film) 31b and a SiN film (second mask insulator) 31c are stacked on the Vpp gate oxide film 31a. The SiN film 31c functions as the stopper in CMP. The guard ring 41 is formed on each surface of well regions 21A, 21B and N-well (NW) 41A. Each guard ring 41 has a structure in which a poly gate electrode (second gate electrode film) 41b and a SiN film (second mask insulator) 41c are stacked on the Vpp gate oxide film 41a. The SiN film 41c functions as the stopper in CMP. The dummy AA pattern 51 is formed on the surface of the Si substrate 11 adjacent to the row decoder circuit 31. The dummy AA pattern 51 has a structure in which a poly gate electrode (second gate electrode film) 51b and a SiN film (second mask insulator film) 51c are stacked on the Vpp gate oxide film 51a. The SiN film 51c functions as the stopper in CMP.

An STI isolation region 12 burying insulator is formed between regions (21 and 41, 41 and 31, 31 and 51).

Conventionally, the guard ring and dummy pattern in the periphery of the row decoder circuit have been formed using a Vcc oxide film. The guard ring and dummy pattern are formed in a high-breakdown-voltage oxide film region. Namely, the guard ring 41 and the dummy AA pattern 51 are formed using Vpp oxide films 41a and 51a, respectively. In this way, it is possible to offset the step (global step shown by "a" in FIG. 5A) on the upper surface of the stopper SiN film 31c around the high-voltage transistor of the row decoder circuit 31. As a result, the SiN film 31 is prevented from being excessively reduced in thickness, so that a sufficient height (h) to the Vpp oxide film 31a can be secured.

The structure described above is employed, and thereby, the following effect is obtained. It is possible to prevent only residual film thickness of the SiN film 31c from being greatly reduced between the guard ring 41 and the row decoder circuit 31 and between the row decoder circuit 31 and the dummy AA pattern 51. Therefore, it is possible to solve the conventional problem of reducing a margin for CMP when gate pre-forming process is employed because the NAND-type flash memory has the high-voltage transistor in the row decoder section. As a result, the Vpp oxide film 31a of the row decoder circuit 31 is prevented from being easily damaged, and failure such as gate leakage is prevented.

Second Embodiment

FIG. 2A to FIG. 2D show a method of manufacturing a NAND-type flash memory formed by gate pre-forming process according to a second embodiment of the present invention. Here, the cell section formed with the cell array has a different structure with the Vcc section formed with a guard ring and a dummy AA pattern.

Figure 2A:
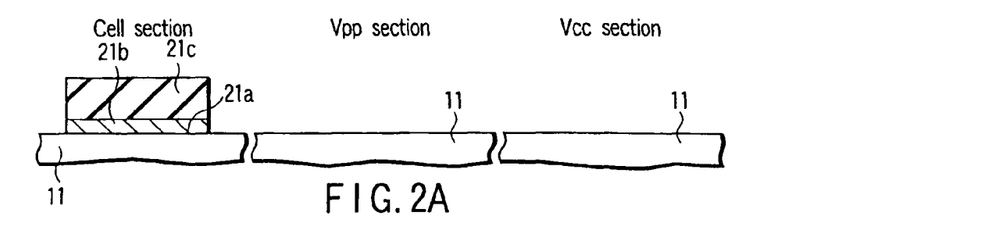
FIG. 2A to FIG. 2D are process cross-sectional views to explain a method of manufacturing a NAND-type flash memory according to a second embodiment of the present invention.

As shown in FIG. 2A, the following films are formed in the array region (cell section) on the Si substrate 11. The films are Vcc oxide film (first gate insulator 21a) having the first thickness, poly gate electrode (first gate electrode film) 21b and stopper SiN film (first mask insulator) 21c. In this case, various materials are deposited on the Si substrate 11, and thereafter, patterning is carried out. The Vcc oxide film 21a, poly gate electrode 21b and stopper SiN film 21c formed in peripheral regions (Vpp section/Vcc section) other than the array region are removed. In this way, the Si substrate 11 of the peripheral region is exposed.

Figure 2B:
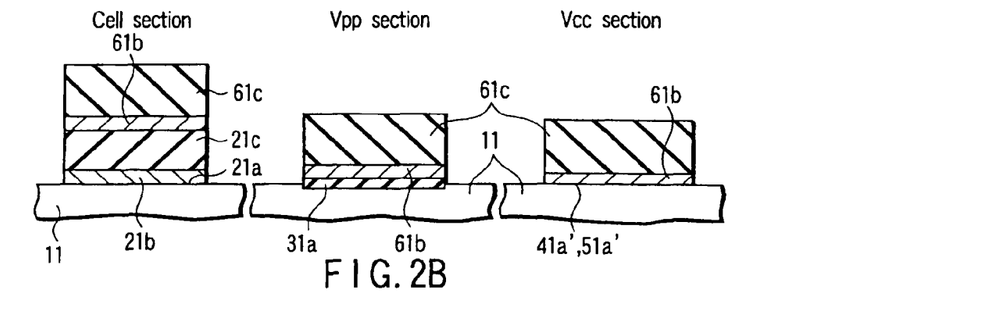

As illustrated in FIG. 2B, one region (Vpp section) of the peripheral regions on the Si substrate is formed with the Vpp oxide film (second gate insulator) 31a having a second thickness greater than the first thickness of the Vcc oxide film 21a. The other region (Vcc section) of the peripheral regions is formed with Vcc oxide films (third gate insulator) 41a' and 51a' having a thickness the same as the first thickness of the Vcc oxide film 21a. Thereafter, a poly gate electrode material 61b and stopper SiN film material 61c are successively deposited on the stopper SiN film 21c, Vpp oxide film 31a and Vcc oxide films 41a' and 51a'. In this case, the thickness of the stopper SiN film material 61c is made greater than that of the stopper SiN film 21c.

Figure 2C:
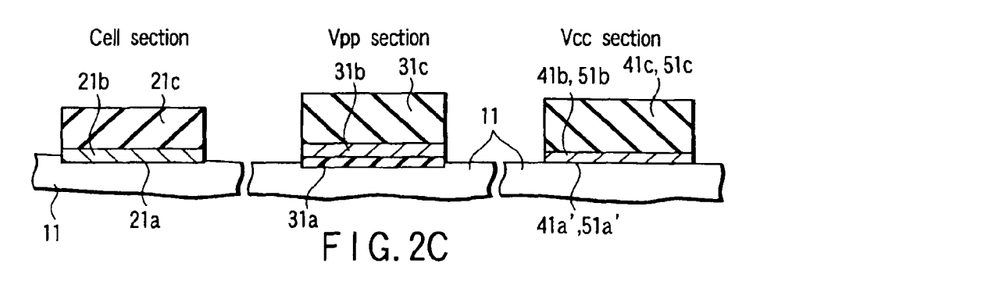

As depicted in FIG. 2C, the poly gate electrode material 61b and stopper SiN film material 61c formed on the cell section is removed. In this way, the poly gate electrode (second gate electrode film) 31b and the stopper SiN film (second mask insulator) 31c are stacked on the Vpp oxide film 31a of the Vpp section. The poly gate electrodes (second gate electrode film) 41b, 51b and the stopper SiN film (second mask insulator) 41c, 51c are stacked on the Vcc oxide film 41a' and 51a' of the Vcc section, respectively.

Figure 2D:
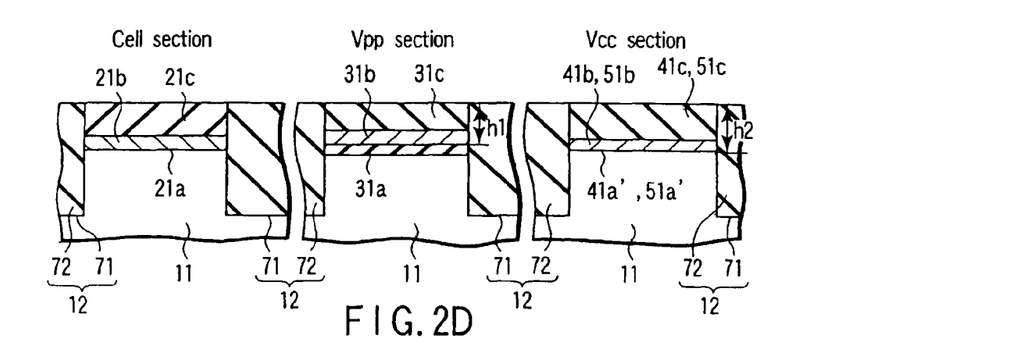

As seen from FIG. 2D, an isolation trench 71 is correspondingly formed on the surface of the Si substrate 11 between the cell section and peripheral regions, that is, Vpp section/Vcc section (STI formation). A buried insulator 72 is deposited, and thereafter, planarizing by CMP is carried out, and thus, a STI-structure isolation 12 is formed.

Thereafter, memory cell, row decoder circuit (high-voltage transistor), and guard ring and dummy AA pattern are formed with respect to cell section, Vpp section, and Vcc section, respectively (although these formations are not shown). In this manner, a NAND-type flash memory is realized.

In the embodiment, the SiN film material 61c (31c, 41c, 51c) of the peripheral regions (i.e., Vcc and Vpp sections) is formed to be thicker than the SiN film material 21c of the cell section. In this way, it is possible to prevent the thickness of the SiN film 31c from being reduced by CMP. In addition, it is possible to make large enough the height h1 to the Vpp oxide film 31a and the height h2 to Vcc oxide film 41a', 51a'. Therefore, this serves to prevent gate oxide film (Vpp oxide film 31a) from being damaged in the process after CMP; as a result, a sufficient margin for CMP can be achieved.

As described above, the SiN film used as the stopper in CMP for STI formation is formed separately in its thickness in the cell section and the peripheral regions. More specifically, the SiN film of the Vpp section is formed to be thicker than that of the cell section. In this way, it is possible to increase the residual film thickness of the SiN film of the high-voltage transistor in process. As a result, a sufficient margin for CMP can be achieved.

In addition, the second embodiment has the following advantage, unlike the first embodiment. Namely, Vcc oxide films 41a' and 51a' of the guard ring 41 and the dummy AA pattern 51 formed in the Vcc section need not be formed to have the same thickness as the Vpp oxide film 31a.

Third Embodiment

FIG. 3A to FIG. 3D show a method of manufacturing a NAND-type flash memory formed by gate pre-forming process according to a third embodiment of the present invention. Here, the cell section formed with the cell array and the Vcc section formed with the guard ring and the dummy AA pattern have the same structure.

Figure 3A:
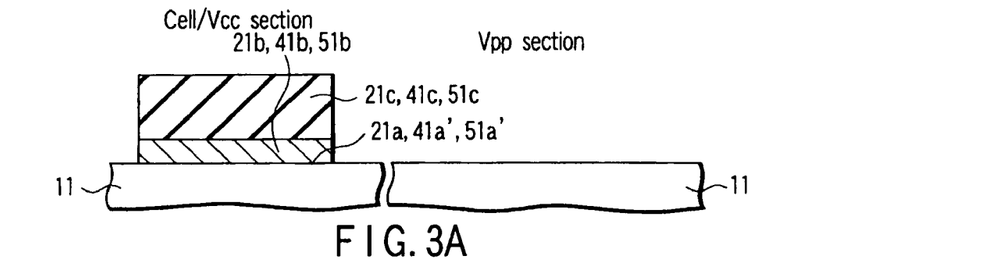
FIG. 3A to FIG. 3D are process cross-sectional views to explain a method of manufacturing a NAND-type flash memory according to a third embodiment of the present invention.

As shown in FIG. 3A, the following films are formed in the array region (cell section) and Vcc section (first peripheral region) on the Si substrate 11. The films are Vcc oxide films (first gate insulator) 21a, 41a' and 51a' having the first thickness, poly gate electrodes (first gate electrode film) 21b, 41b and 51b and stopper SiN films (first mask insulator) 21c, 41c and 51c. In this case, various materials are deposited on the Si substrate 11, and thereafter, patterning is carried out. The Vcc oxide films 21a, 41a' 51a', poly gate electrodes 21b, 41b, 51b and stopper SiN films 21c, 41c, 51c formed in a Vpp section (second peripheral region) other than the array region and the Vcc section are removed. In this way, the Si substrate 11 of the Vpp section is exposed.

Figure 3B:
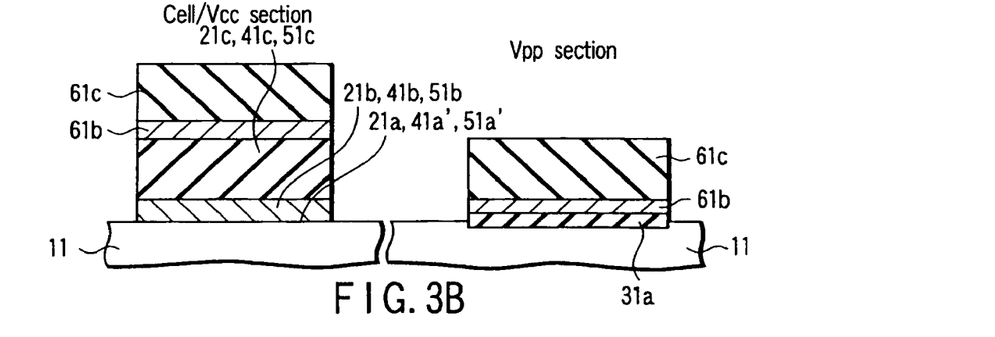

As illustrated in FIG. 3B, the Vpp section on the Si substrate is formed with the Vpp oxide film (second gate insulator) 31a having the second thickness thicker than the Vcc oxide film 21a. Thereafter, a poly gate electrode material 61b and stopper SiN film material 61c are successively deposited on the stopper SiN films 21c, 41c, 51c and the Vpp oxide film 31a. In this case, the thickness of the poly gate electrode material 61b is made thinner than the poly gate electrodes 21b, 41b and 51b. In addition, the stopper SiN film material 61c is deposited to be flush with the upper surface of the stopper SiN films 21c, 41c and 51c.

Figure 3C:
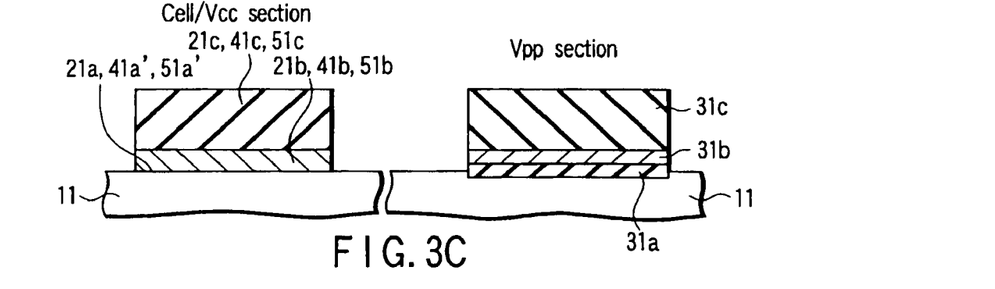

As depicted in FIG. 3C, the poly gate electrode material 61b and stopper SiN film material 61c formed on the cell and Vcc sections are removed. In this way, the poly gate electrode (second gate electrode film) 31b and the stopper SiN film (second mask insulator) 31c are stacked on the Vpp oxide film 31a of the Vpp section.

Figure 3D:
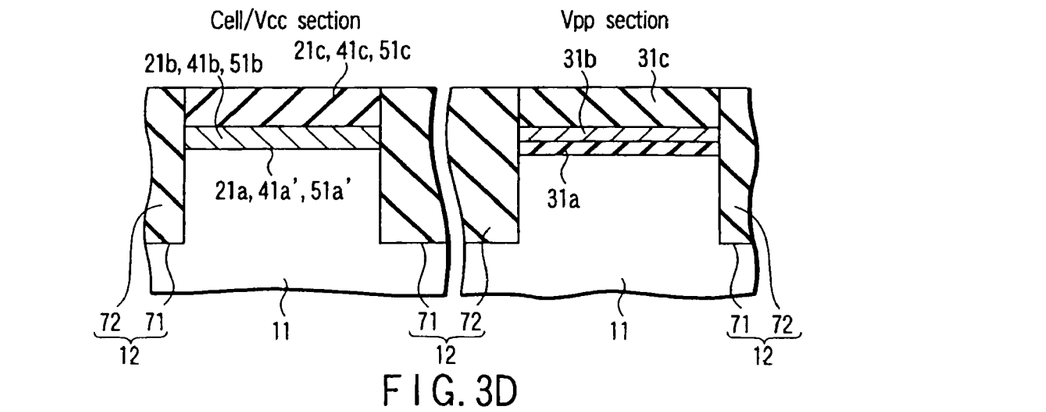

As seen from FIG. 3D, an isolation trench 71 is correspondingly formed on the surface of the Si substrate 11 between the cell section and the Vpp/Vcc section (STI formation). A buried insulator 72 is deposited, and thereafter, planarizing by CMP is carried out, and thus, a STI isolation 12 is formed.

Thereafter, memory cell, row decoder circuit (high-voltage transistor) and guard ring and dummy AA pattern are formed with respect to cell section, Vpp section and Vcc section, respectively (these formations are not shown). In this way, a NAND-type flash memory is realized.

In the embodiment, stopper SiN films 31c and 21c of the row decoder circuit and the cell section are readily formed in a state their upper surfaces are flush with each other. In this way, it is possible to prevent an extra reduction of the thickness of the SiN film 31c in CMP, and to sufficiently take the height to the Vpp oxide film 31a. Therefore, this serves to prevent the gate oxide film (Vpp oxide film 31a) from being damaged in the process after CMP; as a result, a sufficient margin for CMP can be achieved.

As described above, the SiN film used as the stopper in CMP for STI formation is formed separately in its thickness in the cell section and the Vpp section. More specifically, stopper SiN films of the Vpp section and the cell section are readily formed in the state that their upper surfaces are flush with each other. In this way, it is possible to increase the residual film thickness of the SiN film of the high-voltage transistor in process. As a result, a sufficient margin for CMP can be achieved.

In addition, according to the third embodiment, only Vpp oxide film 31a can be formed to be thicker than Vcc oxide films 41a' and 51a', like the second embodiment described before.

Fourth Embodiment

Figure 4A:
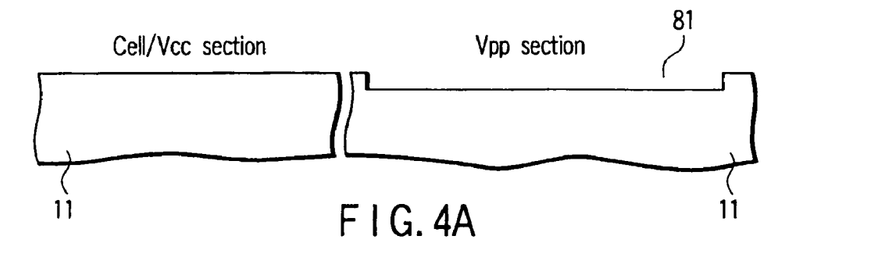
FIG. 4A to FIG. 4C are process cross-sectional views to explain a method of manufacturing a NAND-type flash memory according to a fourth embodiment of the present invention.
Figure 4B:
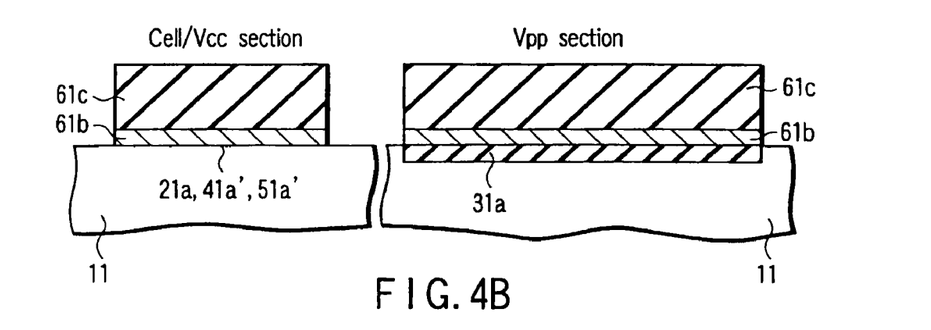
Figure 4C:
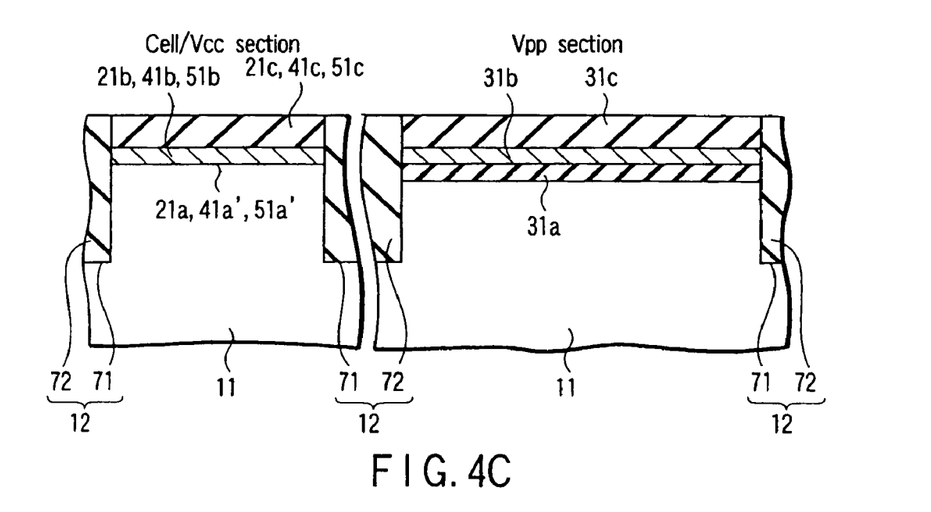

FIG. 4A to FIG. 4C show a method of manufacturing a NAND-type flash memory formed by gate pre-forming process according to a fourth embodiment of the present invention. Here, the cell section formed with the cell array and the Vcc section formed with guard ring and dummy AA pattern have the same structure.

As shown in FIG. 4A, the surface of the Si substrate 11 is selectively etched using a photo engraving process (PEP) and dry etching techniques. In this way, the Vpp section (first peripheral region) is formed with a recess 81, which has a height lower than the cell and Vcc sections. In this case, the depth of the recess 81 is approximately the same as the thickness of the Vpp oxide film (first gate insulator) formed therein.

As illustrated in FIG. 4B, a Vpp oxide film 31a having a first thickness is formed in the recess 81 formed at the Vpp section on the Si substrate 11. Vcc oxide films (second gate insulator) 21a, 41a' and 51a' having a second thickness less than that of the Vpp oxide film 31a are formed in the array region (cell section) and the Vcc section (second peripheral region) on the Si substrate 11. Thereafter, a poly gate electrode material 61b and stopper SiN film material 61c are successively deposited on the Vcc oxide films 21a, 41a, 51a and the Vpp oxide film 31a. In this way, poly gate electrodes (second gate electrode film) 21b, 41b, 51b and stopper SiN films (second mask insulator) 21c, 41c, 51c are stacked on the Vcc oxide films 21a, 41a' and 51a' of the cell and Vcc sections. The poly gate electrode (first gate electrode film) 31b and the stopper SiN film (first mask insulator) 31c are stacked on the Vpp oxide film 31a of the Vpp section. In this case, the Vpp oxide film 31a is formed in the recess 81, and thereby, the surface of the stopper SiN film 31c is approximately flush with that of the stopper SiN films 21c, 41c and 51c.

As depicted in FIG. 4C, an isolation trench 71 is correspondingly formed on the surface of the Si substrate 11 between the cell/Vcc section and the Vpp section, that is, Vpp section/Vcc section (STI formation). A buried insulator 72 is deposited, and thereafter, planarizing by CMP is carried out, and thus, a STI isolation 12 is formed.

Thereafter, a memory cell, row decoder circuit (high-voltage circuit) and guard ring and dummy AA pattern are formed with respect to the cell section, Vpp section and Vcc section, respectively (these formations are not shown). In this way, a NAND-type flash memory is realized.

In the embodiment, the silicon surface of the Vpp section is positioned lower than the cell section by the film thickness of the Vpp oxide film 31a. Thus, the upper surface of the SiN film 31c is readily flush with that of the SiN film 21c of the cell section. In this way, it is possible to prevent an excess reduction of thickness of the SiN film 31c by CMP, and to achieve a sufficient height to the Vpp oxide film 31a. Therefore, this serves to prevent gate oxide film (Vpp oxide film 31a) from receiving damage in process after CMP; as a result, a sufficient margin for CMP can be achieved.

As described above, the SiN film used as the stopper in CMP for STI formation is formed separately in its thickness in the cell section and peripheral regions. More specifically, the stopper SiN film of the Vpp section is formed to have the same thickness as that of the cell section. In this way, it is possible to increase the residual film thickness of the SiN film of the high-voltage transistor in process. As a result, the margin for CMP can be sufficiently obtained.

In addition, according to the fourth embodiment, only Vpp oxide film 31a can be formed to be thicker than Vcc oxide films 41a' and 51a', like the second and third embodiment described before.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a non-volatile semiconductor memory device including a semiconductor substrate having a memory cell array region and a peripheral circuit region, comprising:
    etching a first upper surface of the semiconductor substrate in the peripheral circuit region except a second upper surface of the semiconductor substrate in the memory cell array region with a dry etching method;
    forming a first gate insulating film on the first upper surface of the semiconductor substrate, the first gate insulating film including a first thickness;
    forming a second gate insulating film on the second upper surface of the semiconductor substrate, the second gate insulating film including a second thickness being thinner than the first thickness;
    simultaneously forming a gate electrode film on the memory cell array region and the peripheral circuit region;
    simultaneously forming a mask film on the gate electrode film in the memory cell array region and the peripheral circuit region;
    forming trenches on the memory cell array region and the peripheral circuit region;
    depositing a buried insulating film on the memory cell array region and the peripheral circuit region; and
    polishing an upper surface of the buried insulating film in the memory cell array region and the peripheral circuit region with the mask film as a stopper.

2. The method according to claim 1, wherein the first thickness of the first gate insulating film is substantially equal to a difference between a level of the first upper surface and a level of the second upper surface.

3. The method according to claim 1, wherein a level of an upper surface of the mask film which is formed in the memory cell array region is substantially equal to a level of an upper surface of the mask film which is formed in the peripheral circuit region.

4. The method according to claim 1, wherein the gate electrode film includes a polysilicon film.

5. The method according to claim 1, wherein the mask film includes a silicon nitride film.

6. The method according to claim 1, wherein each of the first and second gate insulating films includes a silicon oxide film.

7. The method according to claim 1, wherein the gate electrode film is formed on the first gate insulating film in the peripheral circuit region and the second gate insulating film in the memory cell array region.

8. The method according to claim 1 further comprising a high-voltage transistor formed in the peripheral circuit region.

9. The method according to claim 1 further comprising a row decoder circuit formed in the peripheral circuit region.

* * * * *